(12) United States Patent
Shin et al.

(10) Patent No.: US 8,835,746 B2
(45) Date of Patent: Sep. 16, 2014

(54) DEVICE FOR ALIGNING A CONCENTRATION PHOTOVOLTAIC MODULE

(75) Inventors: Hwa-Yuh Shin, Keelung (TW); Hung-Sheng Chiu, Taoyuan County (TW); Yam-Mou Shyu, Taoyuan County (TW); Yi-Ya Hwang, Taoyuan County (TW); Ying-Ru Chen, Taoyuan County (TW)

(73) Assignee: Institute of Nuclear Energy Research, Atomic Energy Council, Lungtan, Taoyuan (TW)

( * ) Notice: Subject to any disclaimer, the term of this patent is extended or adjusted under 35 U.S.C. 154(b) by 734 days.

(21) Appl. No.: 13/117,461

(22) Filed: May 27, 2011

(65) Prior Publication Data

US 2012/0298179 A1    Nov. 29, 2012

(51) Int. Cl.
*H01L 31/00*    (2006.01)
*H01L 31/052*    (2014.01)
*H01L 31/048*    (2014.01)

(52) U.S. Cl.
CPC ............ *H01L 31/0524* (2013.01); *Y02E 10/52* (2013.01); *H01L 31/048* (2013.01)
USPC ............ 136/246; 136/244; 136/251; 136/259

(58) Field of Classification Search
USPC .................................................. 136/243–293
See application file for complete search history.

(56) References Cited

U.S. PATENT DOCUMENTS

| 4,238,246 A | * | 12/1980 | Genequand et al. | 136/248 |
| 5,118,361 A | * | 6/1992 | Fraas et al. | 136/246 |
| 2005/0208842 A1 | * | 9/2005 | Lin et al. | 439/894 |
| 2010/0218804 A1 | * | 9/2010 | Shin et al. | 136/246 |

FOREIGN PATENT DOCUMENTS

JP    2003-258291    *    9/2003    ............ H01L 31/052

* cited by examiner

*Primary Examiner* — Thanh-Truc Trinh
(74) *Attorney, Agent, or Firm* — Jackson IPG PLLC

(57) ABSTRACT

A concentration photovoltaic module includes a radiator, solar cell units, a datum plate, an optical unit and an alignment unit. The radiator includes apertures defined therein. The solar cell units are located on the radiator. The datum plate is located on the radiator. From a lower face of the datum plate extend positioning columns corresponding to the apertures defined in the radiator. The datum plate is provided with marks corresponding to some of the solar cell units. The optical unit is provided with lines near edges thereof. The alignment unit includes a board and light sources. The board is formed with corners corresponding to the lines provided on the datum plate. The light sources are located on the board. The light sources cast light on the solar cell units through the marks.

8 Claims, 2 Drawing Sheets

DEVICE FOR ALIGNING A CONCENTRATION PHOTOVOLTAIC MODULE

BACKGROUND OF INVENTION

1. Field of Invention

The present invention relates to a concentration photovoltaic module and, more particularly, to a device for aligning a concentration photovoltaic module.

2. Related Prior Art

A typical concentration photovoltaic module includes condensers to concentrate sun light to spots on efficient solar cells to reduce the number of solar cells required to convert solar energy into electricity in a piece of land is reduced. Hence, the cost of the photovoltaic module is reduced while the efficiency of the photovoltaic module is increased.

In the concentration photovoltaic module, to align each of the condensers to a related one of the solar cells, the light source must be dot-like. Hence, the concentration photovoltaic module is suitable for outdoor use where the sun acts as dot-like light source necessary for the alignment of the condensers to the solar cells. However, the stability of the brightness of the sun light and the weather conditions are beyond human control. The alignment of the condensers to the solar cells cannot be operated effectively sometimes because of the weather conditions.

The present invention is therefore intended to obviate or at least alleviate the problems encountered in prior art.

SUMMARY OF INVENTION

The primary objective of this invention is to provide a concentration photovoltaic module with a device for aligning condensers to solar cells.

To achieve the foregoing objective, the concentration photovoltaic module includes a radiator, a datum plate, an optical unit and an alignment unit. The radiator includes positioning apertures defined therein. The solar cells are located on the radiator. The datum plate is located on the radiator. The datum plate includes positioning columns corresponding to the positioning apertures and marks corresponding to some of the solar cells. The optical unit is located on the datum plate. The condensers are formed as portions of the optical unit. The optical unit is further formed with lines. The alignment unit includes a board located on the optical unit and light sources located on the board to cast light beams on some of the solar cell units through the marks.

In an aspect, the radiator may be made of aluminum or copper.

In another aspect, each of the solar cell units includes a solar cell and a lens located on the solar cell.

In another aspect, the marks are aligned to some of the solar cell units located near corners of the datum pate.

In another aspect, the optical unit is a glass panel.

In another aspect, the board includes alignment apertures through which the light beams reach some of the solar cell units.

In another aspect, the board includes extensive portions extending from corners thereof corresponding to the lines.

In another aspect, the light sources are lasers.

Other objectives, advantages and features of the present invention will be apparent from the following description referring to the attached drawings.

BRIEF DESCRIPTION OF DRAWINGS

The present invention will be described via detailed illustration of the preferred embodiment referring to the drawings wherein.

DETAILED DESCRIPTION OF PREFERRED EMBODIMENT

Figure 1:
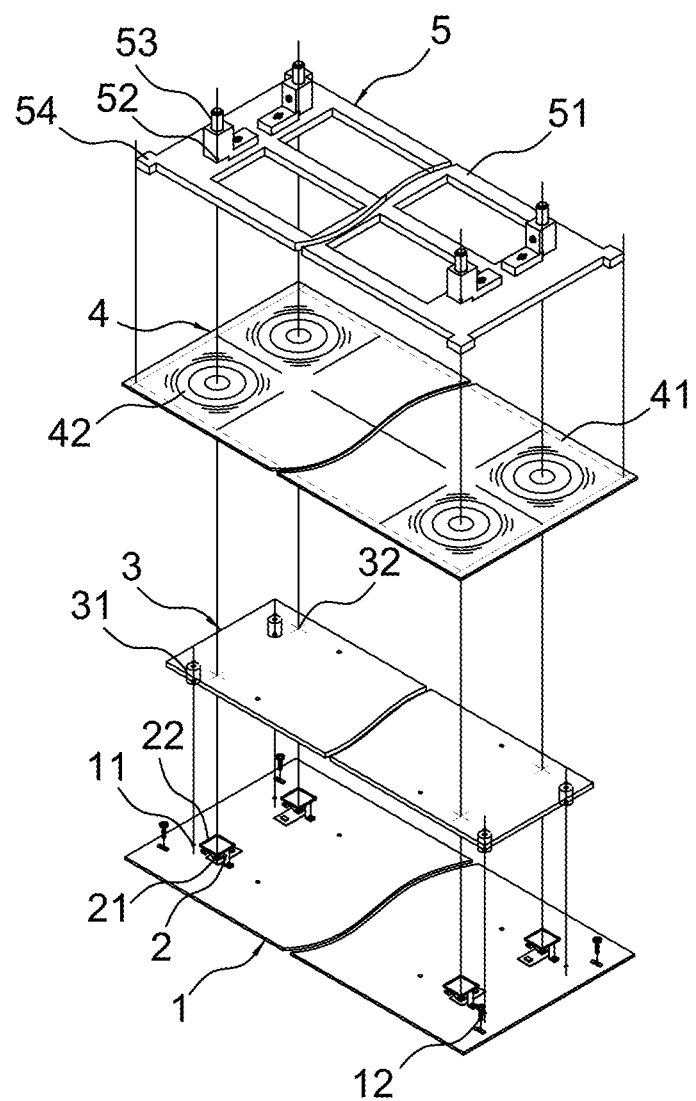
FIG. 1 is an exploded view of a concentration photovoltaic module equipped with a device for aligning condensers to solar cells according to the preferred embodiment of the present invention.
Figure 2:
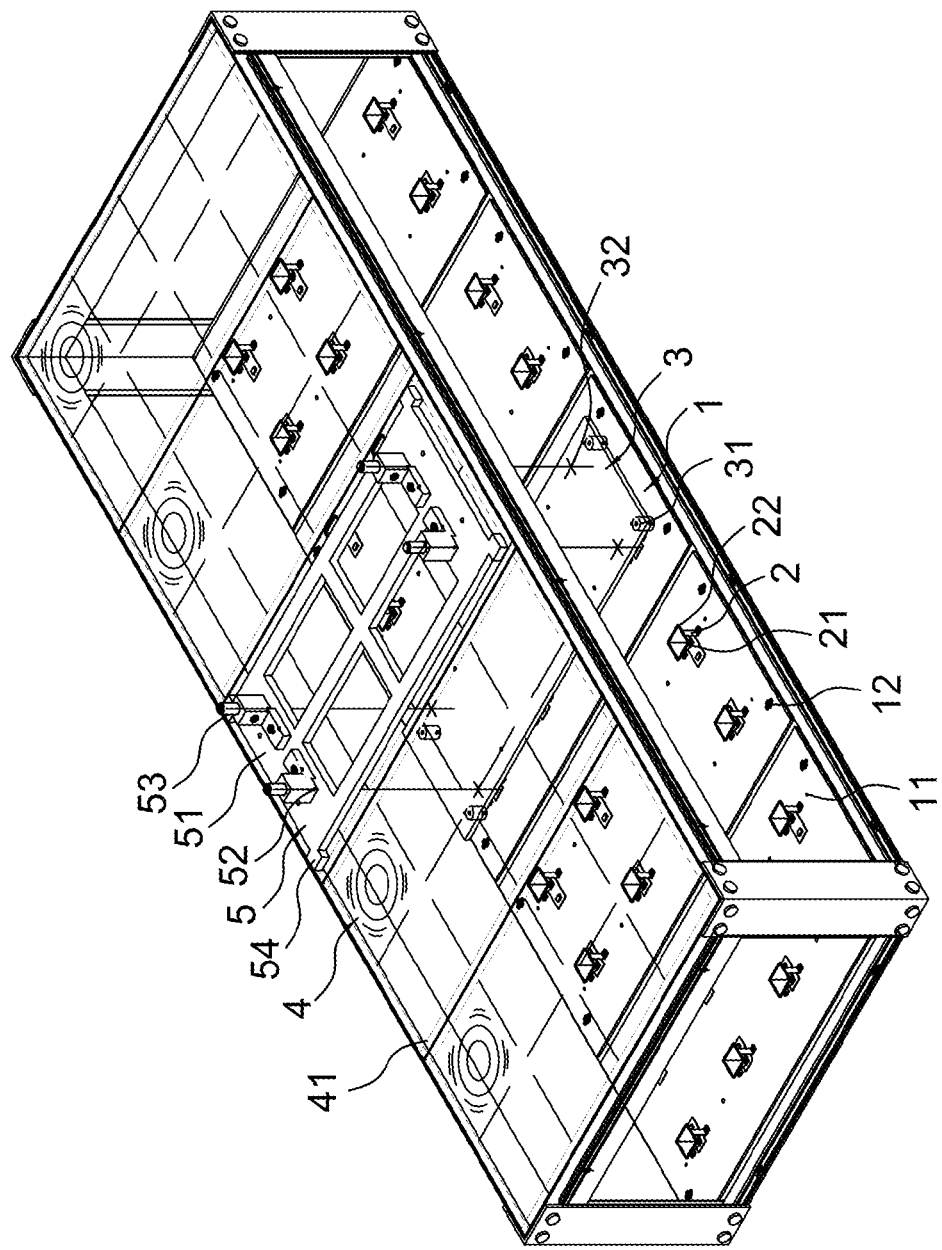
FIG. 2 is a perspective view of the concentration photovoltaic module shown in FIG. 1.

Referring to FIGS. 1 and 2, there is shown a concentration photovoltaic module equipped with a device for aligning condensers to solar cell units according to the preferred embodiment of the present invention. The concentration photovoltaic module includes a radiator 1, solar cell units 2, a datum plate 3, an optical unit 4 and an alignment unit 5. The radiator 1 includes positioning apertures 11 defined therein. The radiator 1 may be made of aluminum or copper.

The solar cell units 2 are located on the radiator 1. Each of the solar cell units 2 includes a solar cell 21 and a lens 22 located on the solar cell 21.

The datum plate 3 is located on the radiator 1. From a lower face of the datum plate 3 extend positioning columns 31 corresponding to the positioning apertures 11 defined in the radiator 1. The datum plate 3 is provided with marks 32 corresponding to at least some of the solar cell units 2.

The optical unit 4 is located on the datum plate 3. The optical unit 4 includes lines 41 marked thereon near edges thereof and condensers 42 formed thereon corresponding to the solar cell units 2. The optical unit 4 may be a glass panel.

The alignment unit 5 includes a board 51 located on the optical unit 4 and light sources 53 located on the board 51. The board 51 includes alignment apertures 52 defined therein and extensive portions 54 extending from corners thereof. The extensive portions 54 of the board 51 are located corresponding to the lines 41 provided on the optical unit 4. The light sources 53 cast light beams on some of the solar cell units 2 through the alignment apertures 52, some of the condensers 42 and the marks 32. The light sources 53 are lasers preferably.

As discussed above, the radiator 1, the solar cell units 2, the datum plate 3, the optical unit 4 and the aliment unit 5 are used together to let sun light be cast on the solar cell units precisely.

In operation, the datum plate 3 is located on the radiator 1. The positioning columns 31 of the datum plate 3 are aligned to the positioning apertures 11 of the radiator 1. The marks 32 of the datum plate 3 are aligned to some of the solar cell units 2 located on the radiator 1. Then, the optical unit 4 is located on the datum plate 3. Some of the condensers 42 are aligned to the solar cell units 2 that are aligned to the marks 32. Finally, the alignment unit 5 is located on the optical unit 4. The extensive portions 54 of the board 51 of the alignment unit 5 are aligned to the lines 41 of the optical unit 4. The light sources 53 cast light beams on the solar cell units 2 through the alignment apertures 52 and the marks 32. Thus, the radiator 1, the solar cell units 2, the datum plate 3, the optical unit 4 and the alignment unit 5 are aligned to each other precisely.

If the light sources 53 do not cast light beams on the solar cell units 2 through the alignment apertures 52 and the marks 32, tuning can be executed on the radiator 1, the solar cell units 2, the datum plate 3, the optical unit 4 and the alignment unit 5 to cause the light sources 53 to precisely cast light beams on the solar cell units 2 through the alignment apertures 52 and the marks 32. Thus, the condensers 42 are precisely aligned to the solar cell units 2. Therefore, sun light can precisely be cast on the solar cell units 2 through the condensers 42.

As discussed above, the condensers 42 can be aligned to the solar cell units 2 precisely. Therefore, the efficiency of the concentration photovoltaic module is high. Furthermore, the alignment is easy. Moreover, the structure of the concentration photovoltaic module is simple.

The present invention has been described via the detailed illustration of the preferred embodiment. Those skilled in the art can derive variations from the preferred embodiment without departing from the scope of the present invention. Therefore, the preferred embodiment shall not limit the scope of the present invention defined in the claims.

The invention claimed is:

1. A concentration photovoltaic module including:
   a radiator including a plurality of positioning apertures defined therein;
   a plurality of solar cell units located on the radiator and each alignable with a corresponding one of the plurality of positioning apertures;
   a datum plate located on the radiator and formed with a plurality of positioning columns each corresponding to a corresponding one of the positioning apertures and a plurality of marks each corresponding to one of the plurality of the solar cell units;
   an optical unit located on the datum plate and formed with a plurality of lines and condensers corresponding to the solar cell units; and
   an alignment unit including a board located on the optical unit and a plurality of light sources each located on the board to cast light beams on a corresponding one of the solar cell units through the respective marks.

2. The concentration photovoltaic module according to claim 1, wherein the radiator is made of a material selected from the group consisting of aluminum and copper.

3. The concentration photovoltaic module according to claim 1, wherein each of the solar cell units includes a solar cell and a lens located on the solar cell.

4. The concentration photovoltaic module according to claim 1, wherein each of the marks is aligned to a corresponding one of the solar cell units located near corners of the datum pate.

5. The concentration photovoltaic module according to claim 1, wherein the optical unit is a glass panel.

6. The concentration photovoltaic module according to claim 1, wherein the board includes alignment apertures through which the light beams reach a corresponding one of the solar cell units.

7. The concentration photovoltaic module according to claim 1, wherein the board includes extensive portions extending from corners thereof corresponding to the lines near edges thereof.

8. The concentration photovoltaic module according to claim 1, wherein the light sources are lasers.

* * * * *